United States Patent [19]
Elwell

[11] Patent Number: 5,315,154
[45] Date of Patent: May 24, 1994

[54] ELECTRONIC ASSEMBLY INCLUDING HEAT ABSORBING MATERIAL FOR LIMITING TEMPERATURE THROUGH ISOTHERMAL SOLID-SOLID PHASE TRANSITION

[75] Inventor: Dennis F. Elwell, San Clemente, Calif.

[73] Assignee: Hughes Aircraft Company, Los Angeles, Calif.

[21] Appl. No.: 61,096

[22] Filed: May 14, 1993

[51] Int. Cl.$^5$ .............................................. H01L 23/02
[52] U.S. Cl. ..................................... 257/707; 257/720
[58] Field of Search ............... 257/706, 707, 713, 714, 257/718, 720, 722; 165/80.2, 80.3, 80.4, 80.5

[56] References Cited

U.S. PATENT DOCUMENTS

| | | | |
|---|---|---|---|
| 4,816,173 | 3/1989 | Achard et al. | 257/70 |
| 4,994,903 | 2/1991 | Wroe et al. | 257/747 |
| 5,194,928 | 3/1993 | Cronin et al. | 257/629 |

OTHER PUBLICATIONS

"Solid State Phase Change Materials For Thermal Energy Storage In Passive Solar Heated Building", D. Benson et al., Sep. 1984, U.S. Department of Energy reprot No. SERI/TP-255-2494 (DE85000535).

Primary Examiner—Rolf Hille
Assistant Examiner—S. V. Clark
Attorney, Agent, or Firm—Georgann S. Grunebach; Terje Gudmestad; W. K. Denson-Low

[57] ABSTRACT

A solid polyhydric alcohol material (16) is provided in thermal contact with an electronic component (14) which will be damaged if its temperature rises above a certain value. The material (16), known as a phase change material (PCM), exhibits an isothermal solid-solid phase transition at a predetermined temperature (T1) below which damage to the component (14) will not occur. Heat generated by the component (14) and its environment causes the temperature of the component (14) and the PCM (16) to increase to the transition temperature (T1). Further generated heat is absorbed by the PCM (16) as latent heat and causes a phase transition, such that no further increase in temperature occurs. This arrangement prevents the temperature of the component (14) from rising above the transition temperature (T1) under transient thermal overload conditions.

26 Claims, 5 Drawing Sheets

ELECTRONIC ASSEMBLY INCLUDING HEAT ABSORBING MATERIAL FOR LIMITING TEMPERATURE THROUGH ISOTHERMAL SOLID-SOLID PHASE TRANSITION

BACKGROUND OF THE INVENTION

1. Field of the Invention

The present invention generally relates to the field of electronics, and more specifically to an arrangement for preventing the temperature of an electronic assembly from rising above a safe value.

2. Description of the Related Art

Electronic components, such as integrated circuit chips, power transistors and the like will become damaged or destroyed if the temperature thereof is allowed to rise above a certain value, typically on the order of 200° C. The normal operating temperature of an electronic assembly is generally maintained below this level by a heat sink arrangement, which may include convection air or liquid cooling. An alternative passive cooling arrangement involves the use of substrate materials such as beryllia (BeO) and aluminum nitride (AlN) which have high thermal conductivity and act as heat spreaders to conduct heat away from high power electronic components.

However, transient overload conditions often occur which cause the temperature of an electronic assembly to increase above the safe level for brief periods of time. The obvious expedient is to design the cooling system to accommodate the highest anticipated transient temperature. This is inefficient, however, since the size and capacity of the cooling system must be substantially larger than that required for normal operation.

Investigations involving solid solutions of polyhydric alcohols have been made for the purpose of passive heat storage such as described in U.S. Department of Energy report no. SERI/TP-255-2494 (DE85000535), entitled "SOLID STATE PHASE CHANGE MATERIALS FOR THERMAL ENERGY STORAGE IN PASSIVE SOLAR HEATED BUILDINGS", by D. Benson et al, Sept. 1984. These materials, known as phase change materials (PCMs), exhibit a reversible isothermal solid-solid phase transition at temperatures of 43° C.–188° C. During the transition, the crystalline structures of the PCMs change from layered to cubic in response to absorbed latent heat. For passive solar heating of buildings, the PCMs are used to absorb heat during the hot daylight hours and regenerate the heat during the cold nighttime hours. The latent heat (enthalpy) which is absorbed or regenerated during the phase transitions is high, on the order of 131–323 kiloJoules per kilogram (kJ/kg), making polyhydric alcohols highly efficient for temporary heat storage as described in the report.

SUMMARY OF THE INVENTION

The present invention utilizes a previously unexploited property of solid polyhydric alcohols to provide efficient absorption of transient thermal overloads in electronic assemblies.

More specifically, a solid polyhydric alcohol material is provided in thermal contact with an electronic component which will be damaged if its temperature rises excessively. The material, known as a phase change material (PCM), exhibits an isothermal solid-solid phase transition at a predetermined temperature below which damage to the component will not occur.

Heat generated by the component and its environment causes the temperature of the component and the PCM to increase to the transition temperature. Further generated heat is absorbed by the PCM as latent heat and causes a phase transition, such that no further increase in temperature occurs.

The present arrangement prevents the temperature of the component from rising above the transition temperature of the PCM under transient thermal overload conditions.

The preferred solid polyhydric alcohols for practicing the invention include neopentyl glycol ($C_5H_{12}O_4$), trimethylol ethane ($C_5H_{12}O_3$) and pentaerythritol ($C_5H_{12}O_4$), having transition temperatures of 43, 81 and 188° C. respectively. These alcohols can be used singly or combined in solid solution to provide a PCM with a desired transition temperature which is within or outside of the range of the individual constituents.

The thermal conductivity of solid polyhydric alcohols is low. However, elements or particles such as powder grains, fins or rods, which are formed of a material such as aluminum having higher thermal conductivity than the PCM, can be distributively embedded in the PCM to enhance the heat transfer efficiency. It is also within the scope of the invention to provide a compositionally graded PCM or a plurality of PCM layers which have different transition temperatures and are arranged according to the temperature gradient in the electronic assembly such that they will undergo phase transitions together.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
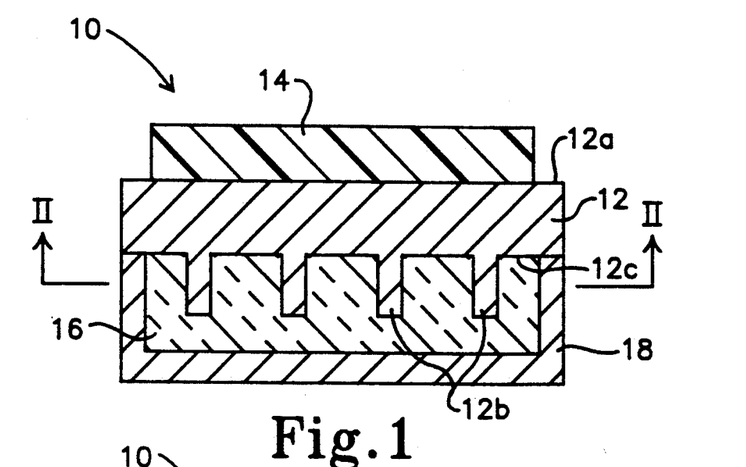
FIG. 1 is a simplified sectional view illustrating an electronic assembly including a phase change material (PCM) for limiting the maximum temperature of an electronic component in accordance with the present invention.
Figure 2:
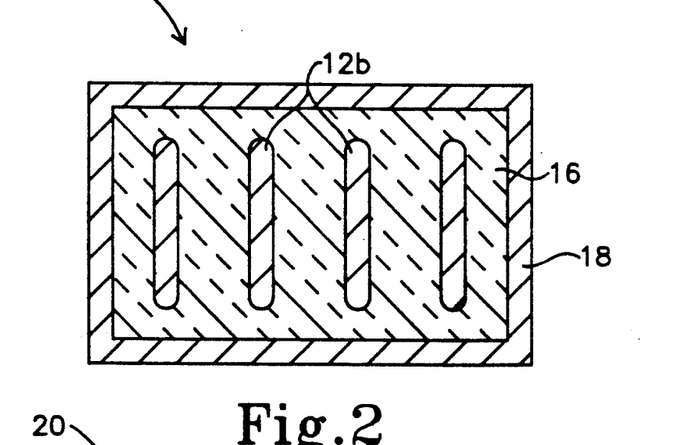
FIG. 2 is a section taken on a line II—II of FIG. 1.

As illustrated in FIGS. 1 and 2, an electronic assembly 10 embodying the present invention includes a thermally conductive heat sink or substrate 12 having a surface 12a on which an electronic component 14 is mounted. The component 14 may be an integrated circuit chip, power transistor, conductor wire or trace, or any other electronic component for which the temperature must not be allowed to rise above a certain value.

The substrate 12 is made of aluminum or other suitable material having high thermal conductivity, and is illustrated as including elements in the form of fins 12b which extend away from a surface 12c thereof. The surface 12c is opposite to the surface 12a. However, it is within the scope of the invention, although not specifically illustrated, to additionally or alternatively form fins on the lateral sides of the substrate 12.

In accordance with the invention, a solid phase change material (PCM) 16 is formed on the surface 12c of the substrate 12 and embeds the fins 12b therein. The PCM 16 is formulated to exhibit an isothermal solid-solid phase transition at a predetermined temperature T1 below which the component 14 will not be damaged. Typically, integrated circuit chips are subject to damage at temperatures in excess of 200° C., and the temperature T1 is selected to have a lower value, for example 188° C.

The PCM 16 is preferably a solid polyhydric alcohol or solid solution of two or three polyhydric alcohols, although the invention is not so limited. Solid polyhydric alcohols suitable for practicing the invention include neopentyl glycol (NPG) ($C_5H_{12}O_2$), trimethylol ethane (TME) ($C_5H_{12}O_3$) and pentaerythritol (PE) ($C_5H_{12}O_4$).

The molecular structure of these polyhydric alcohols consists of a central carbon atom with four side groups which can be —CH or —C$_2$OH such that materials have the general structure $C(CH_3)_{4-x}(CH_2OH)_x$, where $0 \leq X \leq 4$. Upon absorption of heat in excess of that required to raise the temperature of the PCM 16 to the transition temperature T1, the PCM 16 transitions from a layered to a cubic structure, with a high latent heat (enthalpy) resulting primarily from the rearrangement of hydrogen bonds.

NPG has a transition temperature T1 of 43° C., an enthalpy of 131 kJ/kg, a melting point T2 of 126° C., a density of 1.046 g/cm$^3$ and a thermal conductivity of 0.25 watts per meter-degree Kelvin (W/mK). TME has a transition temperature T1 of 81° C., an enthalpy of 193 kJ/kg, a melting point T2 of 198° C., a density of 1.193 g/cm$^3$ and a thermal conductivity of 0.36 W/mK. PE has a transition temperature T1 of 188° C., an enthalpy of 323 kJ/kg, a melting point T2 of 260° C., a density of 1.33 g/cm$^3$ and a thermal conductivity of 1.0 W/mK. These materials are commercially available at low cost from a number of sources. It will be noted that the enthalpy increases with the transition temperature T1.

Figure 3:
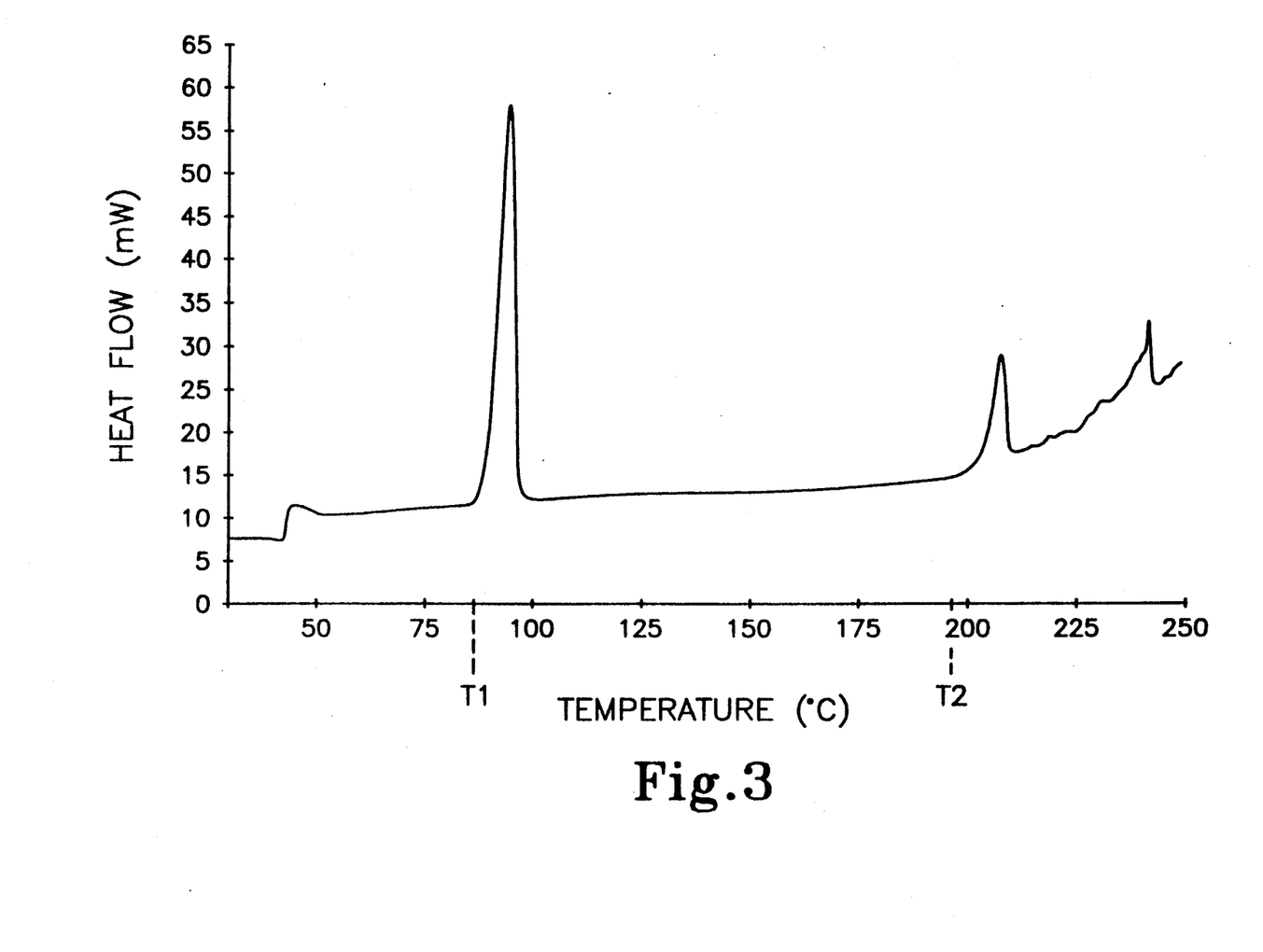
FIG. 3 is a graph illustrating the solid-solid phase transition and melting points of the PCM of the assembly of FIGS. 1 and 2.

FIG. 3 illustrates the heat flow into the PCM 16 as a function of temperature for the exemplary case of TME. The heat flow has a low value of 10-15 milliwatts up to the melting point T2 of 198° C., except for a sharp peak value of approximately 60 milliwatts in the vicinity of the transition temperature T1 of 89° C.

In operation, the component 14 and its surrounding environment will generate heat. The substrate 12 is designed to dissipate sufficient heat to prevent the temperature of the component 14 from rising above T1 under normal operating conditions. However, large transient amounts of heat will be generated for short periods of time if the assembly 10 is electrically overloaded or if the ambient temperature rises to an inordinately high level for some reason. In such a case, the temperature of the component 14, substrate 12 and PCM 16 will rise to the transition temperature T1. Further heat will be absorbed by the PCM 16 to cause an isothermal solid-solid phase transition.

During the phase transition, the heat generated by the component 14 and its environment is absorbed by the PCM 16 as latent heat. However, since the phase transition is isothermal (occurs at one temperature), the temperature of the PCM 16, substrate 12 and component 14 will not rise above T1. Thus, the temperature of the component 14 is clamped at or prevented from rising above T1.

Upon termination of the thermal overload condition, the PCM 16 will undergo a reverse isothermal solid-solid phase transition and regenerate the absorbed latent heat. However, the temperature will remain at or below T1, and the component 14 will not be damaged.

The amount of heat which can be absorbed by the PCM 16 without the temperature rising above T1 is proportional to the amount (mass) of the PCM 16. The mass will be different for each particular application, and is selected in accordance with the amount of heat generated by anticipated transient overload conditions for the particular assembly 10.

Although the PCM 16 will undergo its phase transition at the temperature T1, the temperature of the component 14 will somewhat exceed T1 due to the relatively low thermal conductivity of the PCM 16. Thus, the temperature to which the component 14 is limited by the PCM 16 is approximately equal to, but slightly higher than T1 due to the non-ideal thermal conductivity. The difference depends on the configuration of the particular application, and should be taken into account in the design of the assembly 10.

The transition temperature T1 is also selected in accordance with the particular type of component 14 which is to be protected from excessive temperature, and can vary over a wide range depending on the particular application. PE, for which T1=188° C., is particularly suitable for clamping the temperature of integrated circuit chips below 200° C., and has the highest enthalpy value of 323 kJ/kg. Lower values of T1 can be provided by NPG or TME singly, or by a solid solution of two or more solid polyhydric alcohols. A transition temperature below 43° C. can be provided by a solid solution of NPG and TME and/or PE.

The present invention is also suitable for an application in which the electronic assembly 10 is part of an apparatus, such as a missile, which is designed to operate for only a short time (one flight). A large amount of heat is generated in such an application and the ambient temperature of the assembly 10 progressively increases, but the temperature of the component 14 must not be allowed to rise above a certain value. In such a case, the mass of the PCM 16 is selected to be sufficient to absorb enough heat by isothermal solid-solid phase transition during the maximum anticipated time of operation of the apparatus to prevent the temperature of the component 14 from exceeding T1.

Solid polyhydric alcohols are soluble in water. This is advantageous in that it allows the PCM 16 to be easily removed for repair or reworking of the assembly 10, but is disadvantageous if the assembly 10 must operate in a humid environment. For this reason, an arrangement is preferably provided for waterproofing the PCM 16. As illustrated in FIGS. 1 and 2, a cover 18 made of a material such as aluminum or plastic which is impervious to water is attached to the surface 12c of the substrate 12 for sealingly enclosing the PCM 16. The cover 18, in addition to waterproofing the material 18, may provide a hermetic (airtight) seal.

Solid polyhydric alcohols have relatively low values of thermal conductivity as listed above. If the fins 12b were not provided, an inordinately large amount of time might be required, depending on the particular application, for heat to propagate from the surface of the PCM 16 nearest the component 14 to the opposite surface of the PCM and thereby cause the entire mass of the PCM 16 to undergo the phase transition. The fins 12b are made of a material such as aluminum having much higher thermal conductivity than the PCM 16, and distribute heat from the component 14 into the mass of the PCM 16 to enhance the heat absorbing efficiency of the PCM 16.

Figure 4:
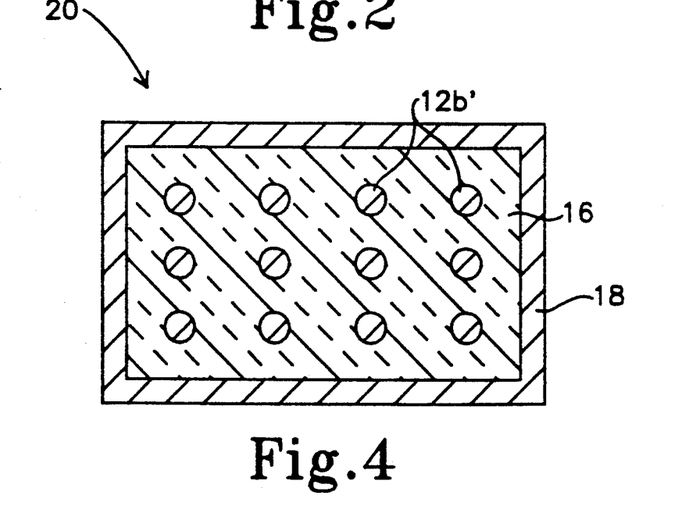
FIGS. 4, 5, 6, 7, 8, 9 and 10 are similar to FIG. 2, but illustrate alternative embodiments of the present electronic assembly respectively.

The scope of the invention encompasses elements other than the fins 12b for accomplishing heat distribution. As illustrated in FIG. 4, an electronic assembly 20 is similar to the assembly 10 with the exception that the elongated fins 12b are replaced by fingers or rods 12b' which extend perpendicularly away from the surface 12c. The rods 12b' may have a circular or any other suitable cross-section.

The number and configuration of the fins 12b or rods 12b' are selected in accordance with the particular application, and are generally designed to produce maximum isothermal heat absorption with minimum overall size and weight.

Figure 5:
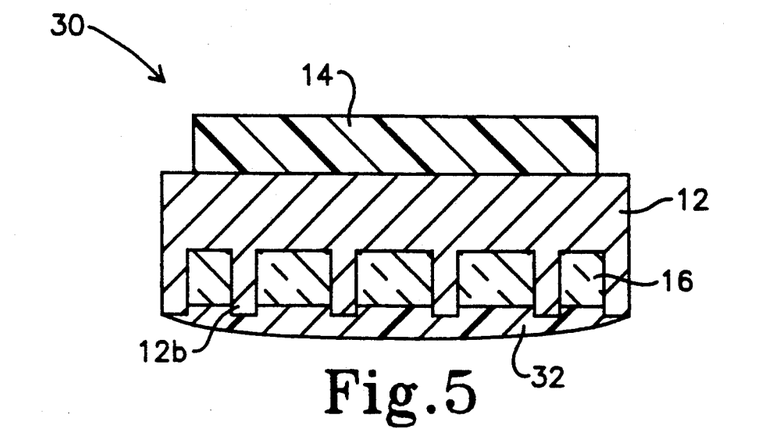

Whereas the assembly 10 includes the cover 18 for waterproofing the PCM 16, an electronic assembly 30 illustrated in FIG. 5 includes a layer 32 of waterproof material such as epoxy resin which sealingly covers the PCM 16 and accomplishes the same purpose.

Figure 6:
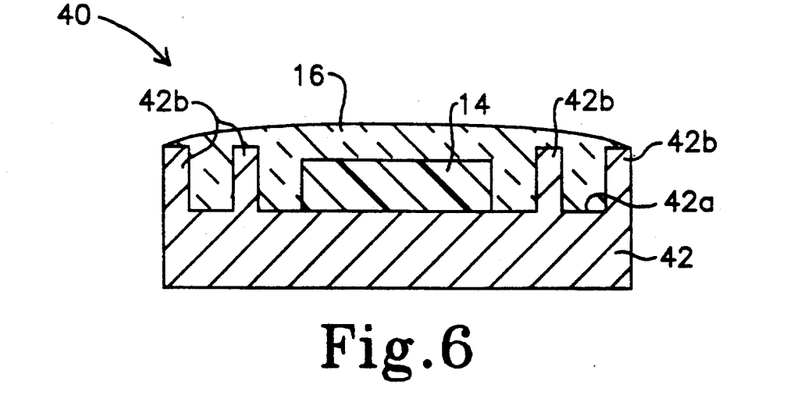

In the electronic assembly 10, the component 12 and PCM 16 are disposed on opposite sides of and separated by the substrate 12. FIG. 6 illustrates an electronic assembly 40 including a substrate 42 having a surface 42a on which the component 14 is mounted. Fins 42b extend away from the surface 42a on the opposite lateral sides of the component 14. The PCM 16 is formed on the surface 12a in direct contact with the component 14, and embeds the component 14 and fins 42b therein. In the assembly 40, the PCM 16 absorbs heat directly from the component 14, and also from the substrate 42 through the surface 42a and fins 42b.

Figure 7:
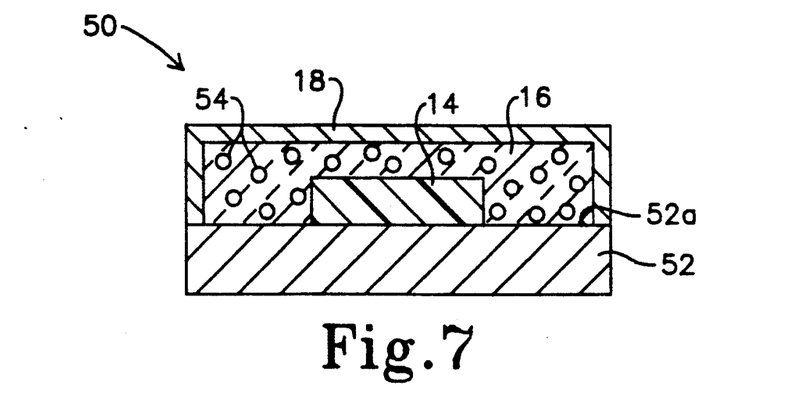

FIG. 7 illustrates another electronic assembly 50 embodying the invention which includes a substrate 52 which may be made of aluminum or other material having high thermal conductivity and which provides a heat sink function. Alternatively, the substrate 52 may be made of a conventional substrate material such as silicon which has lower thermal conductivity.

The component 14 is mounted on a surface 52a of the substrate 52. The PCM 16 is formed on the surface 52a and embeds the component 14 therein. The PCM 16 is waterproofed by means of the cover 18.

The assembly 50 further includes elements in the form of particles 54 of a material having high thermal conductivity which are distributively embedded in the PCM 16. The particles 54 perform the same function as the fins and rods described above by distributing heat throughout the mass of the PCM 16. The particles 54 may be powder grains, tiny rods, needles, or have any other suitable shape. The particles 54 may be made of aluminum, graphite, copper, or any other material having high thermal conductivity. Graphite has been found to reduce the thermal undercooling of the PCM 16, although it increases the viscosity of polyhydric alcohols in liquid form.

Figure 8:
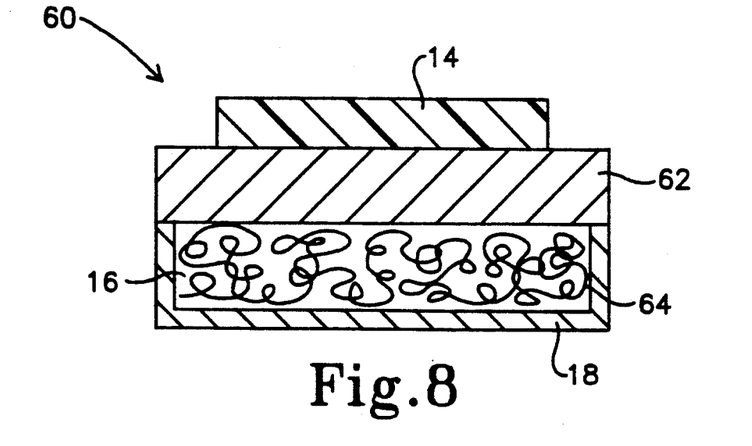

FIG. 8 illustrates another electronic assembly 60 including a substrate 62 of high thermal conductivity material. The component 14 and PCM 16 are disposed on opposite sides of the substrate 62, with the cover 18 being provided for waterproofing the PCM 16. The assembly 60 further includes elongated elements in the form of strands 64 of high thermal conductivity material which are distributively embedded in the PCM 16 and extend in different directions.

The strands 64 may be separate, or as illustrated, interconnected to form a continuous strand. The strands 64 may be arranged to form a regular mesh, or as illustrated, twisted into a random configuration in the manner of steel wool. The strands 64 are preferably made of copper, although the scope of the invention includes any suitable high thermal conductivity material. The fabrication of the assembly 60 preferably includes pressing the strands 64 against the substrata 62, and impregnating the strands 64 with the PCM using heat and pressure.

Figure 9:
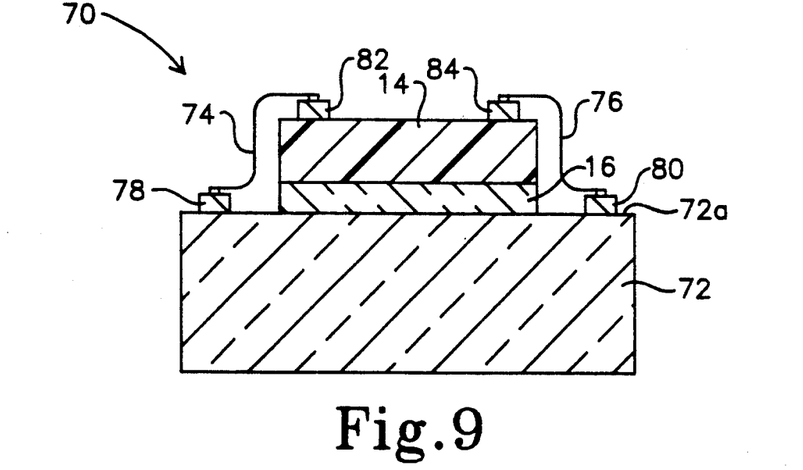

FIG. 9 illustrates another electronic assembly 70 embodying the present invention, including a substrate 72 made of a conventional substrate material such as silicon. The component 14 is disposed above a surface 72a of the substrate 72, with the PCM 16 being sandwiched between the component 14 and surface 72a. Wire bonds 74 and 76 interconnect metallization pads 78 and 80 on the surface 72a with contact pads 82 and 84 on the component 14 respectively. The PCM 16 absorbs heat from both the component 14 and substrate 72.

In each of the electronic assemblies described above, a thermal gradient exists in the PCM 16, with the temperature being maximum nearest the component 14 (or other heat source) and minimum farthest therefrom. For this reason, the portion of the PCM 16 nearest the heat source begins the phase transition at a time which can be considerably sooner than the more remote portions of the PCM 16. This undesirable effect is enhanced by the low thermal conductivity of solid polyhydric alcohols.

Figure 10:
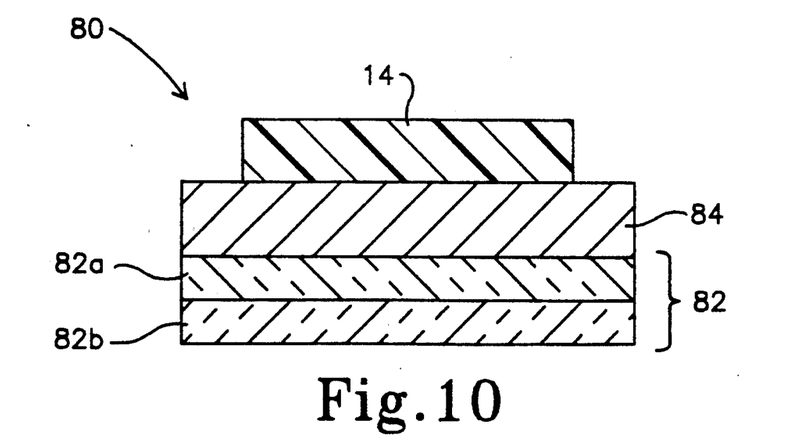

FIG. 10 illustrates an electronic assembly 80 in which the entire PCM, here designated as 82, goes through a phase transition at substantially the same time and temperature of the component 14. The component 14 and PCM 82 are disposed on opposite sides of a thermally conductive substrate 84. The PCM 82 includes a first material layer 82a which is formed directly on the substrate 84, and a second material layer 82b which is formed on and thermally communicates with the component 14 through the first layer 82a.

The first layer 82a is formed of a PCM such as PE which has a relatively high transition temperature $Tl_1$. The layer 82b is formed of another PCM such as TME, NPG of a solid solution of two or three PCMs which has a lower transition temperature $Tl_2$. The transition temperatures of the layers 82a and 82b are selected in accordance with the temperature gradient across the PCM 82 such that the temperature in the layer 82b will reach its transition temperature $Tl_2$ when the temperature in the layer 82a reaches its transition temperature $Tl_1$. In this manner, the layers 82a and 82b will undergo phase transitions together, and the entire PCM 82 will effectively absorb heat as a mass.

Although only two layers 82a and 82b are illustrated in FIG. 10, three or more layers may be provided within the scope of the invention. It is also possible to provide a single compositionally graded PCM layer which provides a transition temperature gradient corresponding to the temperature gradient in the PCM layer. This configuration is applicable to any of the embodiments of the invention described above.

Figure 11:
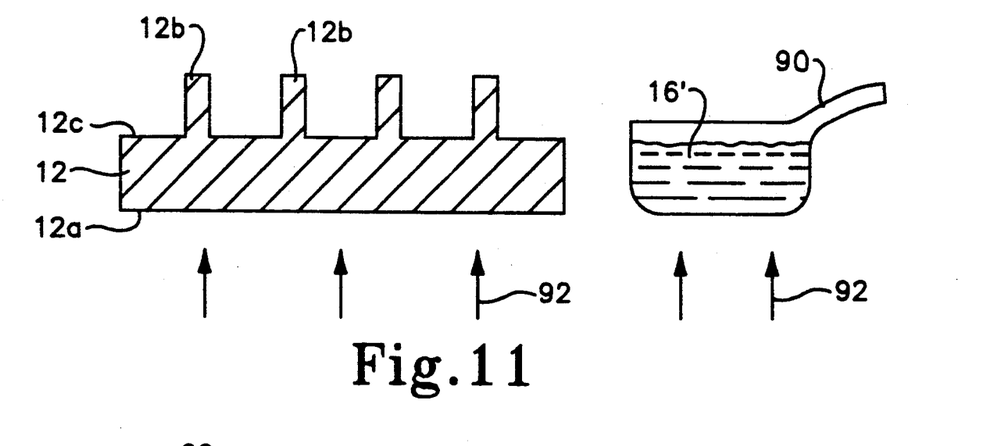
FIGS. 11, 12 and 13 are simplified views illustrating a method of fabricating an electronic assembly according to the present invention.
Figure 12:
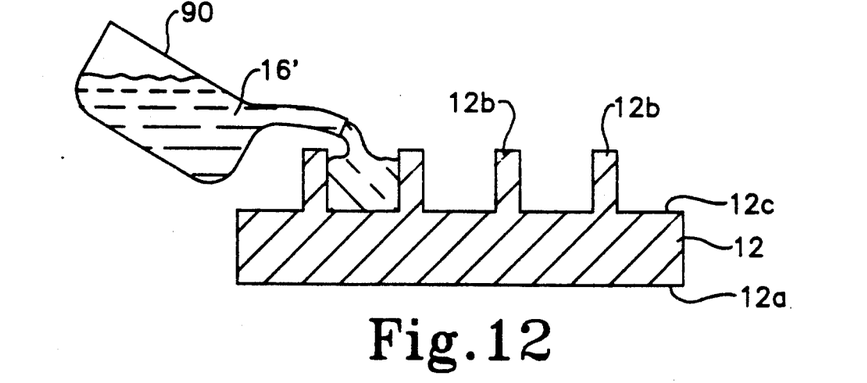
Figure 13:
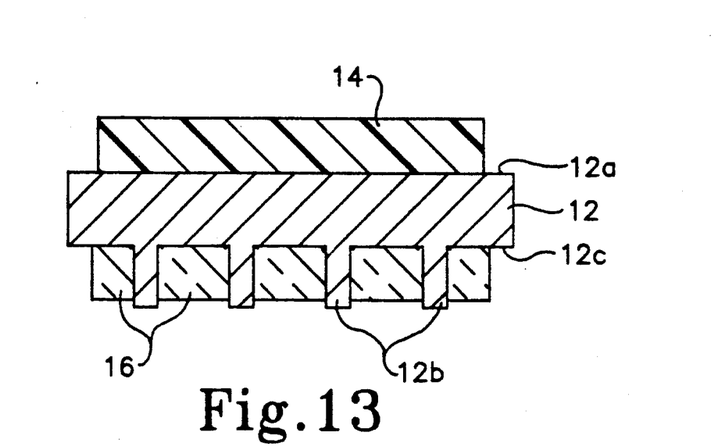

FIGS. 11 to 13 illustrate a preferred method of fabricating the electronic assembly 10 which minimizes formation of voids in the PCM 16. Although not explicitly illustrated, the method is also applicable to the embodiments of the invention illustrated in FIGS. 1, 2, 4, 5, and 8 to 10.

In FIG. 11, the PCM 16 is provided in a container 90. The substrate 12 and PCM 16 are heated as indicated by arrows 92 to at least the melting point T2 of the PCM 16 such that the PCM 16 is converted to liquid form as indicated at 16'.

In FIG. 12, the heat 92 is removed, and the liquid PCM 16' is poured or otherwise caused to flow onto the surface 12c of the substrate 12. Since the temperature of the substrate 12 is above the melting point T2 of the PCM 16', the PCM 16' flows onto the surface 12c without the formation of voids which might occur if the liquid PCM 16' were suddenly cooled by the substrate 12. A jig (not shown) prevents the PCM 16' from flowing onto the peripheral portion of the surface 12c which mates with the cover 18.

In FIG. 13, the substrate 12 and PCM 16' are allowed to cool through the melting point T2 to ambient temperature, at which the PCM 16 is converted to solid form. The component 14 is then mounted on the surface 12a of the substrate 12, and the cover 18 is attached to complete the electronic assembly as illustrated in FIGS. 1 and 2.

Due to the high melting points T2 of solid polyhydric alcohols, including 265° C. for PE, it is advantageous to apply the PCM to a substrate and cool the assembly to ambient temperature prior to mounting a component. However, a component can be mounted prior to applying the PCM. This latter method is applicable to the embodiments of FIGS. 6 and 7.

Where the substrate is heated to the melting point of the PCM, application of the PCM should be completed in the shortest possible length of time to preclude damage to the component. It is also within the scope of the invention to apply liquid PCM to a substrate and/or component without heating the substrate/component, although this increases the risk of void formation in the PCM.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. An electronic assembly, comprising:
an electronic component that generates heat when operated;
a thermally conductive heat sink in direct contact with said electronic component for dissipating heat generated by said electronic component; and
a mass of a heat absorbing material in direct contact with said heat sink for absorbing heat from and limiting the temperature of said heat sink to a predetermined temperature, said heat absorbing mass having a lower thermal conductivity than said heat sink, with said heat sink interfacing between said electronic component and said heat absorbing mass, said heat absorbing mass including a solid material which exhibits an isothermal solid-solid phase transition at approximately said predetermined temperature, and absorbing heat from said electronic component through said heat absorbing mass during electrical or thermal overloads of said electronic component to limit the electronic component's temperature to approximately said predetermined temperature.

2. An assembly as in claim 1, in which said solid material comprises a polyhydric alcohol.

3. An assembly as in claim 2, in which said polyhydric alcohol has the structure $C(CH_3)_{4-x}(CH_2OH)_x$, where $0 \leq X \leq 4$.

4. An assembly as in claim 2, in which said polyhydric alcohol is selected from the group consisting of neopentyl glycol ($C_5H_{12}O_2$), trimethylol ethane ($C_5H_{12}O_3$) and pentaerythritol ($C_5H_{12}O_4$).

5. An assembly as in claim 1, in which said heat sink is at least partially embedded in said heat absorbing mass.

6. An assembly as in claim 5, in which said heat sink is formed of a material selected from the group consisting of aluminum, copper and graphite.

7. An assembly as in claim 5, in which said heat sink includes a plurality of fins that extend into said heat absorbing mass in thermally conductive contact with said mass.

8. An assembly as in claim 5, in which said heat sink includes a plurality of rods that extend into said heat absorbing mass in thermally conductive contact with said mass.

9. An assembly as in claim 1, in which:
said solid material comprises a polyhydric alcohol; and
the heat absorbing mass further comprises waterproofing means.

10. An assembly as in claim 9, in which said waterproofing means comprises a waterproof coating which is sealingly formed over said mass.

11. An assembly as in claim 9, in which said waterproofing means comprises a waterproof container which sealingly encloses said mass.

12. An assembly as in claim 1, in which:
said solid material is configured as a first material layer; and
said heat absorbing mass further comprises a second material layer which thermally communicates with the component through the first material layer and exhibits a solid-solid phase transition at a secondary temperature which is lower than said predetermined temperature.

13. An assembly as in claim 12, in which the first and second material layers are configured such that the second material layer reaches said secondary temperature when the first material layer reaches said predetermined temperature.

14. An assembly as in claim 1 wherein said heat absorbing mass is
compositionally graded and exhibits an isothermal solid-solid phase transition at a temperature which decreases with distance from the component.

15. A temperature limiting mounting assembly for an electronic component that generates heat when operated, comprising:
a thermally conductive heat sink configured to have an electronic component mounted on it in direct thermal contact with the heat sink, said heat sink dissipating heat from an electrical component mounted thereon; and
a mass of a heat absorbing material in direct contact with said heat sink for absorbing heat from and limiting the temperature of said heat sink to a predetermined temperature, said heat absorbing mass having a lower thermal conductivity than said heat sink, with said heat sink interfacing between said heat absorbing mass and an electronic component mounted on the heat sink, said heat absorbing means including a solid material which exhibits an isothermal solid-solid phase transition at approximately said predetermined temperature, and limiting the temperature of an electronic component mounted on said heat sink to approximately said predetermined temperature through thermal conduction through said heat sink to said heat absorbing mass.

16. An assembly as in claim 15, in which said solid material comprises a polyhydric alcohol.

17. An assembly as in claim 16, in which said polyhydric alcohol has the structure $C(CH_3)_{4-x}(CH_2OH)_x$, where $0 \leq X \leq 4$.

18. An assembly as in claim 16, in which said polyhydric alcohol is selected from the group consisting of neopentyl glycol ($C_5H_{12}O_2$), trimethylol ethane ($C_5H_{12}O_3$) and pentaerythritol ($C_5H_{12}O_4$).

19. An assembly as in claim 15, in which said heat sink is at least partially embedded in said heat absorbing mass.

20. An assembly as in claim 19, in which said heat sink is formed of a material selected from the group consisting of aluminum, copper and graphite.

21. An assembly as in claim 19, in which said heat sink includes a plurality of fins that extend into said heat absorbing mass in thermally conductive contact with said mass.

22. An assembly as in claim 19, in which said heat sink includes a plurality of rods that extend into said heat absorbing mass in thermally conductive contact with said mass.

23. An assembly as in claim 15, in which:
said solid material is configured as a first material layer; and
said heat absorbing mass further comprises a second material layer in thermal communication with said first material layer on the opposite side of said first material layer from said heat sink, said second material layer exhibiting a solid-solid phase transition at a secondary temperature which is lower than said predetermined temperature.

24. An assembly as in claim 23, in which first and second material layers are configured such that the second material layer reaches said secondary temperature when the first material layer reaches said predetermined temperature.

25. An assembly as in claim 15, wherein said heat absorbing mass includes substantially no resin.

26. An assembly as in claim 1, wherein said heat absorbing mass includes substantially no resin.

* * * * *